BILATERAL BISTABLE SEMICONDUCTOR SWITCHING MATRIX

Filed June 1, 1959

INVENTORS
ALAN L. McWHORTER
ROBERT H. REDIKER
BY
Edward D. Thomas
AGENT 3,118,130

BILATERAL BISTABLE SEMICONDUCTOR SWITCHING MATRIX

Robert H. Rediker, Newton, and Alan L. McWhorter, Arlington, Mass., assignors to Massachusetts Institute of Technology, Cambridge, Mass., a corporation of Massachusetts Filed June 1, 1959, Ser. No. 817,238
18 Claims. (Cl. 340—166)

The present invention relates to a high speed two-terminal semiconductor device and more particularly to a bistable semiconductor device whose operation at liquid helium temperature utilizes the low temperature avalanche breakdown produced by impact ionization of impurities.

Impact ionization of impurities in uncompensated germanium has been discussed in the literature by Sclar and Burstein, "Impact Ionization of Impurities in Germanium," J. Phys. Chem. Solids, vol. 2, pp. 1–23, March 1957; by Koenig and Gunther-Mohr, "The Low Temperature Electrical Conductivity of n-Type Germanium," J. Phys. Chem. Solids, vol. 2, pp. 268–283, 1957; by Finke and Lautz, "On Impact Ionization in Germanium Single Crystals in the 4.2–10° K. Temperature Range," Zs. f. Naturforsch., vol. 12a, pp. 223–225, March 1957; and by Koenig, "Rate Process and Low Temperature Electrical Conducton in n-Type Germanium," Physical Review, vol. 110, pp. 986, 988, May 15, 1958. At liquid helium temperatures, with low applied voltages, germanium may have a resistivity as high as $10^9$ ohm-cm. The carriers which were mobile and contributed to the conductivity at room temperature are almost all attached to the impurity centers at these low temperatures. The residual conductivity is due either to those few carriers generated thermally and by stray radiation, or to a conduction process in the impurity levels themselves. As the applied voltage is increased, it becomes possible for the free carriers to gain sufficient energy in the electric field to ionize the impurities upon impact. Finally, at some critical voltage the impact ionization rate exceeds the recombination rate and a reversible non-destructive breakdown occurs, similar in many respects to avalanche breakdown in a gas. At the end of the avalanche process, all of the impurities are ionized and the resistance changed by several orders of magnitude. A semiconductor switching matrix with this mode of operation is disclosed in patent application No. 745,145, filed June 27, 1958, of Kingston and McWhorter, now U.S. Patent No. 3,077,578, issued February 12, 1963, assigned to the asignee of the present application, wherein the switching time from the high impedance state to the low impedance state of the order of milli-microseconds makes the device attractive for digital computer switching applications.

When fabricated from uncompensated germanium, the switching matrix is a bilateral device having the electrical characteristics for current flow in either direction of a diode in series wth a battery and thus it can perform the functions of an ordinary diode. By uncompensated germanium is meant germanium having only one type of impurity intentionally added, in a compensated semiconductor both donor and acceptor impurities are intentionally present and there is a compensation effect in which the difference between donor and acceptor concentration determines the predominant charge carrier. A much wider range of applications is made possible by our discovery that for compensated semiconductors in particular compensated germanium there is a region of negative resistance between the high and low impedance states which permits bistable operation. As yet we have no satisfactory explanation for the occurrence of the negative resistance. We have performed experiments which show that it is not a contact effect and that it is reproducible for germanium with the same doping. The property appears to be due to bulk effects, and since both contacts are ohmic, the device is bilateral.

The primary object of the invention is the development of a high speed two-terminal bistable semiconductor device suitable for use as a computer memory element, multivibrator or switching component.

In impact ionization breakdown the region where conductivity is modulated is localized very sharply to the volume where the electric field is above the critical value. The localization occurs because the neutralizing charge of the ionized impurity atoms is immobile, and also because the mean free path of the high energy carriers is short. Because of the localization of the conductivity modulation, many separate elements may be placed on a single semiconductor wafer, each of which can be controlled independently of the state of conduction of adjacent elements. The usual semiconductor difficulties with junctions and contacts are not encountered since impact ionization is a bulk effect. Thus, the large arrays can be fabricated with essentially 100% yield.

Another object of the invention is the fabrication of large arrays of independent bistable elements on a single wafer of semiconductor material.

The above and other objects and advantages of this invention will become more apparent from the following description and accompanying drawing in which.

Figures 1, 2, 4:
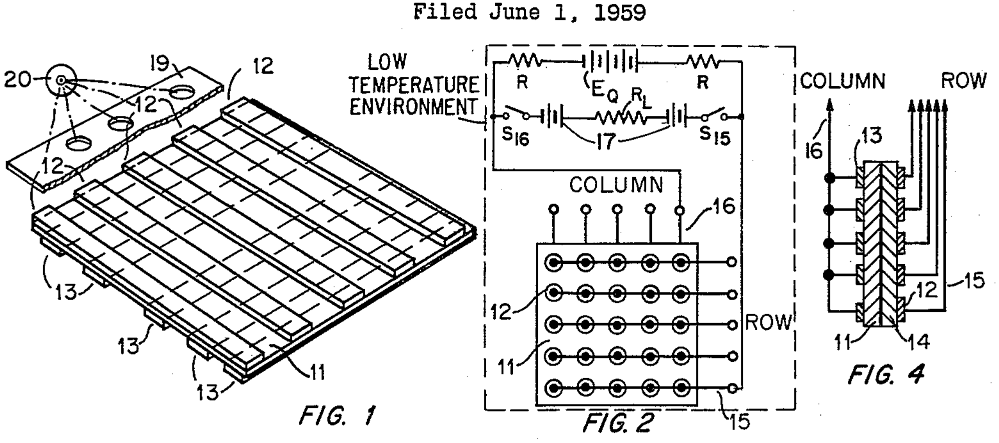
FIGURE 1 shows in perspective an illustrative 5×5 array of bistable elements on a wafer of semiconductor material.
FIGURE 2 is a plan view of an alternate ohmic contact arrangement showing button contacts interconnected to form the rows and columns of a matrix array.
FIGURE 4 is a cross-section, not to scale, showing a compound memory element in which the characteristics of two different compensated germanium wafers are effectively placed in series connection to provide a composite voltage-current response.

Referring to FIGURE 1, a representative 5×5 array of bistable elements on a single wafer 11 of compensated germanium is shown. Shown in solid lines are line ohmic contacts 12 on the upper surface of wafer 11 and in dotted lines are line ohmic contacts 13 on the under surface of wafer 11. Wafer 11 may be of the order of 1 cm. on a side and have a thickness of 0.050 cm. Satisfactory ohmic contacts have been made by alloying indium or indium-gallium buttons, as shown in FIGURE 2. We also find soldering using cerroseal solder, plating indium lines on each face of the wafer followed by heat treatment to produce alloying, evaporating and alloying aluminum lines, all on p-type germanium, or by alloying lead-antimony lines or buttons onto n-type germanium, to be satisfactory ways of obtaining ohmic contacts. No differences have been observed in the electrical characteristics of devices made from the same bulk compensated semiconductor but with different types of ohmic contacts other than those due to variations in geometry such as wafer thickness. Since the impact ionization breakdown is very sharply localized to the volume where the electric field is above the critical value, the spacing between adjacent contacts may be quite close. However, two adjacent elements may be interconnected by external circuitry so that the spacing must be great enough to avoid the development of voltages between them of sufficient amplitude to cause lateral breakdown. We have found that a spacing between adjacent ohmic line contacts of twice the wafer thickness usually avoids difficulties of this sort.

Figure 3:
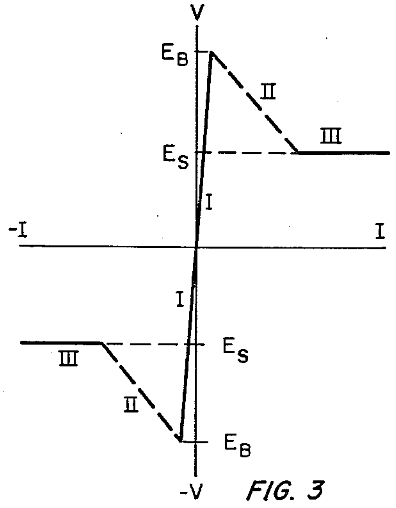
FIGURE 3 is a graph exhibiting typical voltage-current characteristics of a single bistable element fabricated from compensated germanium differing in acceptor and donor element concentrations.

Referring to FIGURE 3, the voltage current characteristics at 4.2° K. are shown for typical samples of indium doped germanium strongly compensated with antimony. A low conductivity pre-breakdown region is indicated by I, at a critical breakdown field $E_B$ a region II of negative resistance occurs and a high conductivity region III is found which requires a minimum field $E_S$ to sustain high conductivity. The data for plotting the graph of FIGURE 3 was obtained both by means of point-to-point D.C. measurements and by pulse measurements for currents below 100 ma. For currents above 100 ma., there is undesirable heating of the sample during D.C. measurements so that only measurements using 10 microsecond pulses were used.

The negative resistance region II is shown by dashed lines since the behavior of the semiconductor crystal in this region is complex and not fully understood at present.

For compensated germanium elements, both the breakdown field and the sustaining field are functions of the impurity densities. Table I lists the properties of a number of 5×5 arrays fabricated from several semiconductor crystals.

These properties were obtained by averaging over the 25 elements in each matrix. Variations in the breakdown and sustaining voltages between elements on one matrix have generally been within ±10% and some of this variation is accounted for by nonuniformities in wafer thickness. Matrices B, C, G and H were fabricated on wafers cut from the same semiconductor crystal. While the wafer of matrix G was heavily sand-blasted, the other three, B, C, and H, were etched. The reproducibility of breakdown and sustaining voltage for all four wafers is good and is apparently unaffected by surface treatment. The reproducibility is believed to be almost entirely a matter of controlling the impurity densities which is not a difficult problem in view of the techniques developed for transistor production. There appears to be a simple linear relationship between sustaining voltage and the total impurity density $(N_A+N_D)$. However, we have not yet discovered a simple empirical relationship for breakdown voltage.

If the applied voltage barely exceeds the critical voltage necessary for avalanche breakdown, the time to change state from high resistance to low resistance may be as long as a microsecond or more. As the applied voltage exceeds the critical voltage by greater amounts, the turn-on time decreases rapidly. For an applied pulse 1.8 times the breakdown voltage, the time required for the current flow to change from its initial value to its pulsed value has been found to be as low as 10 milli-microseconds, a value which seems to be typical for the matrices listed in Table I.

When the voltage across the device is reduced below the value necessary to sustain the low resistance state, the mobile carriers which had been created by impact ionization recombine with the impurity atoms, and the device again exhibits high impedance. The rate at which recombination occurs depends upon the compensation of the semiconductor material. If there are $N_c$ compensating impurities, there are always at least $N_c$ majority impurity sites available for carrier recombination. The cross-section for recombination of each individual site is sufficiently large that recombination times have been found to be more rapid than turn-on time.

If the bistable element is illuminated as by light source 20 through mask 19, FIGURE 1, so as to produce a photocurrent of, or larger than, the dark current at the peak point, the breakdown voltage is considerably reduced. Thus intensity of illumination can be used to control the operation of the device in a way somewhat analogous to the grid voltage in a thyratron. It is readily possible to adjust the electrical bias and pulse amplitude to values so that only an illuminated element can be switched from its high impedance state to its low impedance state by the pulse application. The bias can also be adjusted so that only illumination is required to switch an element from high to low impedance. The response of the device to illumination is much slower, of the order of milliseconds or longer, than it is to electrical pulses.

As shown in Table I, the dark current at the peak point can be varied over a considerable range dependent upon the impurity elements density. If the dark current at the peak point is larger than the photo-current that flows as a result of illumination, the breakdown voltage is not affected by light. Hence, by selection of germanium resistivity and compensation, the operation of bistable elements can be made insensitive to light. Obviously, the intensity of illumination is a factor in such a choice.

Although the mechanism is not known, we have found that light can also be used to switch an element out of breakdown as well as into breakdown. The intensity of light required for this purpose is very small, hardly enough

*Table I*

| P-type Germanium Matrix | Acceptor Density, $N_A$cm.$^{-3}$ | Net Acceptor Density $(N_A-N_D)$ cm.$^{-3}$ | Pre-Breakdown Conductivity mho cm.$^{-1}$ | Current Density at Breakdown amp cm.$^{-2}$ | Breakdown Field Volts, cm.$^{-1}$ | Sustaining Field Volts, cm.$^{-1}$ |
|---|---|---|---|---|---|---|
| A | $10.8\times10^{15}$ | $2.8\times10^{15}$ | $2.3\times10^{-3}$ | $5\times10^{-1}$ | 170 | 140 |
| B* | $4.2\times10^{15}$ | $1.4\times10^{15}$ | $1.9\times10^{-5}$ | $5\times10^{-3}$ | 100 | 40 |
| C* | $4.2\times10^{15}$ | $1.4\times10^{15}$ | ---------- | $6\times10^{-3}$ | 95 | 38 |
| D | $1.65\times10^{15}$ | $1.7\times10^{14}$ | $5.5\times10^{-9}$ | $1\times10^{-5}$ | 140 | 35 |
| E | $1.65\times10^{15}$ | $3.2\times10^{14}$ | $4.2\times10^{-8}$ | $3\times10^{-5}$ | 60 | 20 |
| F | $2.5\times10^{15}$ | $2.1\times10^{15}$ | $2.0\times10^{-5}$ | $2\times10^{-3}$ | 40 | 22 |
| G* | $4.2\times10^{15}$ | $1.4\times10^{15}$ | $1.2\times10^{-4}$ | $3\times10^{-2}$ | 95 | 41 |
| H* | $4.2\times10^{15}$ | $1.4\times10^{15}$ | $2.4\times10^{-5}$ | $6\times10^{-3}$ | 100 | 40 |
| I | $6.8\times10^{15}$ | $4.1\times10^{15}$ | $2.5\times10^{-3}$ | $7\times10^{-1}$ | 145 | 100 |
| J | $2.8\times10^{15}$ | $1.45\times10^{15}$ | $2.0\times10^{-5}$ | $6\times10^{-3}$ | 85 | 41 |
| N-type Germanium | Donor Density, $N_D$cm.$^{-3}$ | Net Donor Density $(N_D-N_A)$ cm.$^{-3}$ | | | | |
| K | $2.5\times10^{15}$ | $1.3\times10^{15}$ | $1.3\times10^{-7}$ | $2\times10^{-5}$ | 45 | 30 |

*Cut from same crystal.

to cause an observable increase in hole concentration. Possibly the effect may be due to the trapping of electrons on donors. At any rate, the same slow time constants are observed that are found in switching into breakdown by illumination.

We have noticed that the voltage $E_S$ of the transition point between region II and region III of FIGURE 3 is increased by the application of a magnetic field. Thus, it is possible to control the switching of a bistable element from low resistance region III to high resistance region I by a magnetic field. The magnetic field effects are orientation dependent, and we have found that at certain orientations of the semiconductor crystal, a relatively low magnetic field of a few hundred gauss can switch a sample from region I to region III. As yet, we have no satisfactory explanation for this behavior.

As the temperature is raised above 4.2° K., the negative resistance region tends to disappear in a fairly narrow temperature range. For the various crystals tested the range in which negative resistance disappears occurs at temperatures varying between 5° K. and 15° K., the higher temperatures being associated with increasing impurity concentration. The sustaining voltage remains essentially constant with temperature for this range.

The usefulness of the above described bilateral bistable element is not limited merely to the high speed with which it can be switched from one stable state to another. As indicated above, the active region of each element is limited to the volume of semiconductor material directly between its two ohmic contacts and hence large arrays with a high density of individual elements can be fabricated on single wafers of germanium. While the fabrication of large arrays in a single manufacturing operation places extremely severe requirements on the reliability and reproducibility of the individual elements, the operation of the present invention is based on impact ionization of impurities, which is a bulk semiconductor phenomenon, and only ohmic contacts to the semiconductor are required. Hence, many of the usual difficulties encountered with junctions and surfaces in the fabrication of transistors and the like are avoided. With the growing use of microprinted circuitry, the fabrication of arrays of well over 32 x 32 nearly identical elements on a wafer of germanium of perhaps one-half inch on a side and five thousandths in thickness is practical both from the view of the elements being independent and every element in the array being operational. Thus, the dimensions of the elements whose electrical characteristics are given in Table I and FIGURE 3 are to be considered as illustrative and not limiting.

Since the breakdown voltage of the bistable element can be made light sensitive, as described above, a bias voltage, such as $E_Q$ of FIGURE 2, and a pulse amplitude less than $[E_B-E_Q]$ can be chosen so that only illuminated elements will be switched from their high impedance state to low impedance state when the pulse is applied. For a matrix, such as is shown in FIGURE 2, in the presence of voltage pulses from sources 17 applied by closing switches $S_{16}$ and $S_{15}$ in time coincidence to column lead 16 and row lead 15, selective illumination through a mask 19, FIGURE 1, from light source 20, can be used to determine whether or not the chosen pulsed element is electrically active. Such a matrix could then be used as a universal function table since by changing the mask to the incident light the function could be changed. As pointed out above, while the matrix elements have a response of the order of millimicroseconds to electrical pulses, their response to light may require times of the order of milliseconds. Other possible applications for light sensitive matrices appear to be for the reading of buffer film storage into a computer and for pattern recognition.

Certain computer matrix applications require that there shall be no cross connections for certain points of matrix intersection. This requirement is easily met by the example of FIGURE 2 wherein button ohmic contacts may be omitted at will to obtain any desired arrangement of electrical connections for any type of computer logic circuitry.

For use as a bistable memory unit, some sort of individual series resistor arrangement for each element in the array is required to prevent any element in its low resistance state from acting as an A.C. short circuit for its column and row.

The series resistors could be made from compensated germanium whose prebreakdown conductivity is much larger than that of the active element. Inspection of Table I shows that wide range of prebreakdown conductivity ranging over five orders of magnitude is obtainable as a function of donor and acceptor impurity concentration.

Figure 5:
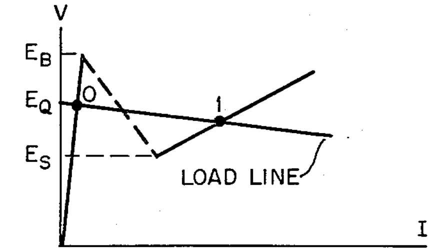
FIGURE 5 is a graph showing a possible composite voltage-current characteristic of the device of FIGURE 4.
Figure 6:
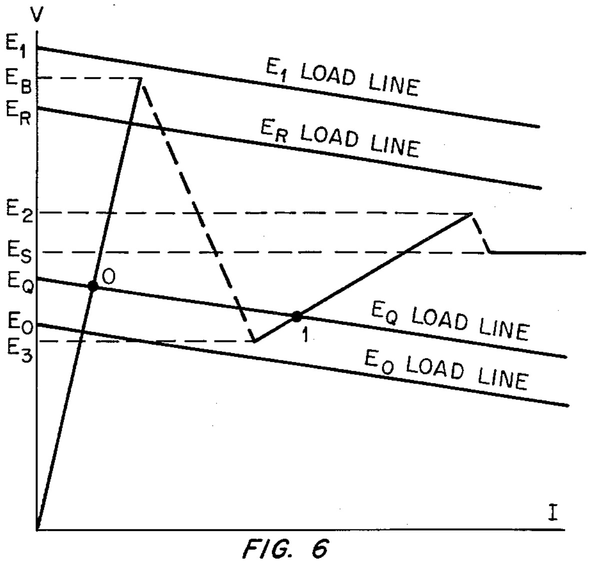
FIGURE 6 is a graph showing a second possible composite voltage-current characteristic of the device of FIGURE 4.

Consequently, a wafer of germanium having two regions of differing majority impurity density, say $2\times10^{15}$ cm.$^{-3}$ and $5\times10^{15}$ cm.$^{-3}$, for example, wafer 11 of FIGURE 4, can have by choice of thickness of wafer 11 and layer 14 either the composite voltage-current characteristic shown in FIGURE 5 or that shown in FIGURE 6. It should be noted that the impurity density is selected to determine the breakdown field and the thickness of the respective layers determines the voltage which must be applied to obtain the breakdown field. Such composite elements may be fabricated by a variety of well-known techniques such as indiffusion, outdiffusion or by growth from the melt.

It should be noticed that the characteristic shown in FIGURE 6 shows a tristable conditions; first, in which both layers are in the prebreakdown state; second, in which both layers are in the postbreakdown state; and third, in which one layer is in postbreakdown state and the second layer is in prebreakdown state.

This concept of composite layers need not stop at two layers since it follows that a plurality of $n$ layers, each differing in majority impurity density can be fabricated in the form of a multilayer sandwich to obtain a device having $n+1$ stable states. Inspection of Table I shows that a wide range of prebreakdown conductivity can be secured by control of the net majority impurity concentration to make a wafer having a composite characteristic of this nature possible.

Figure 7:
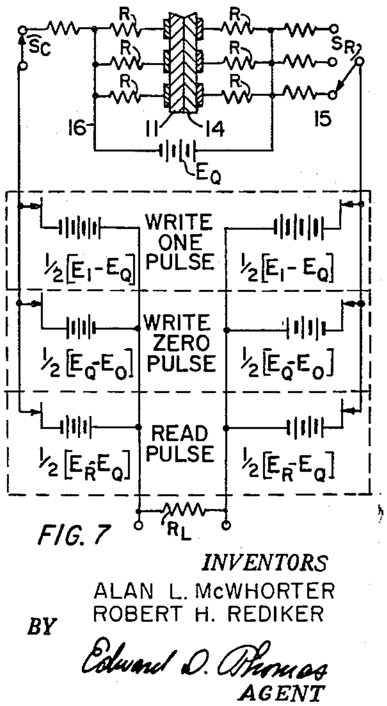
FIGURE 7 is a schematic circuit diagram showing the operation of the device of FIGURE 4 according to the characteristics of FIGURE 6.

The elements whose characteristics are shown in FIGURE 5 and FIGURE 6 can be connected as shown in FIGURE 7 and FIGURE 4 with series row and column resistors R for use in a coincident voltage computer memory. The associated circuitry can be devised readily by those skilled in the art so that either destructive or non-destructive readout can be achieved. An example of one particular method of using composite elements which have the characteristics shown in FIGURE 6 follows. Shown in FIGURE 6 is a possible load line of the column and row resistance and the position of this load line when the "write 0," "write 1," or "read" pulses are applied in coincidence to row and column.

The state when both halves of the composite element are in a low conductivity state will be considered the 0 state and the state when only one portion of the element is in a low conductivity state will be considered the 1 state. Assuming that the device of FIGURE 7 is in the 0 state, a constant D.C. bias of $E_q$ volts is applied to the device. If now a "write 1" pulse of magnitude $\frac{1}{2}(E_1-E_q)$ is applied by row switch $S_R$ and column switch $S_c$ to the row electrode 15 in coincidence with a "write 1" pulse of $\frac{1}{2}(E_1-E_q)$ to the column electrode 16, then the total voltage applied to the element exceeds the breakdown voltage $E_B$ and avalanche breakdown occurs. Upon termination of the "write 1" pulses, $E_q$ being below the sustaining voltage $E_S$ for the composite structure and above the sustaining voltage $E_3$ for the semiconductor material having the lower impurity concentration, the device will be stable at the point marked 1 on the diagram of FIGURE 6.

If the device is in the 1 state, and the coincident row and column "write 1" pulses are applied to the electrodes, the breakdown voltage $E_2$ is exceeded and on termination of the coincident "write 1" pulses the device is still left in the 1 state because the bias voltage $E_q$ is above the sustaining voltage $E_3$. If a "write 1" pulse is applied only to a row or column electrode, the voltage change is only about half the amount required to reach the breakdown voltage $E_B$ and such half-pulses will have no effect.

To write 0, coincident row and column pulses of magnitude $\frac{1}{2}(E_q-E_0)$ are applied to the row and column electrodes with a polarity such that the voltage across the device falls below $E_3$, the voltage required to sustain the device in the 1 state. Upon termination of the "write 0" pulses, the voltage across the device is restored to $E_q$ and the entire compound element has been placed in its low prebreakdown conductivity state regardless of its state prior to the application of the "write 0" pulses. As before, if a "write 0" pulse is applied only to a row or a column electrode, then the voltage across the device remains above the $E_3$ sustaining voltage, and such half-pulses are insufficient to change the state of conductivity of the device.

In order to "read" the state of the device "read" pulses $\frac{1}{2}[E_R-E_q]$ of magnitude greater than $\frac{1}{2}(E_2-E_q)$ and less than $\frac{1}{2}(E_B-E_q)$ are applied in coincidence to the row and column electrodes. When the device is in the 1 state, the breakdown potential $E_2$ is exceeded and the compound element is driven to a state of high conductivity permitting high current flow. When the device is in the 0 state, the applied potential is below the $E_B$ breakdown potential and the compound element remains in its state of low conductivity permitting only a very small current flow. Upon termination of the "read" pulses, the device will return to the same state it was in before the "read" pulses were applied. If a "read" pulse is applied only to a row or a column electrode and the element is in the 0 state no change in its conductivity occurs and only a small current can flow. If a "read" pulse is applied only to a row or a column electrode and the element is in the 1 state, the applied voltage is below the breakdown voltage $E_2$ and again the element remains in a state of relatively low conductivity. Hence, a high current flow can occur, only for the condition that coincident "read" pulses are applied to the row and column electrodes of an element in the 1 state. Thus, it is seen that we have described one way in which the compound structure fabricated in the large arrays with the electrodes arranged in matrix fashion can be operated as a coincident voltage computer memory with a non-destructive read-out.

Those skilled in the art can readily device other techniques applying this invention to computer memory uses. Likewise, it is apparent that the present invention has broad fields of application, not only as a memory element, as a switching element in a matrix, or as a light sensitive function table as described above, but also as a relaxation oscillator or multivibrator element or for any purpose requiring a bistable two-terminal component. Consequently, it is to be understood that the examples disclosed above are to be considered as merely illustrative and not limiting.

As digital computers become faster in operation, not only is it necessary to have faster and more reliable components but also more compact devices are required to minimize lead length and space. The bilateral bistable devices of the present invention, because of their compactness, reliability, low cost, high speed and high off-to-on ratio are practical answers despite the need to operate at liquid helium temperatures.

Further, since the phenomenon of impact ionization is common to all semiconductor materials and is a bulk phenomenon independent of the ohmic contacts, the choice of doping elements, electrode materials, resistivity and semiconductor material is not limited to the specific examples which may have been selected by way of example to illustrate the manner of practicing the invention.

What is claimed:

1. A bistable semiconductor switching device comprising a crystal of compensated semiconductor material containing predetermined concentrations of both acceptor and donor impurity elements, a pair of spaced electrodes making ohmic contact thereto, means for cooling said crystal to a temperature at which said impurity elements are deionized and said compensated semiconductor crystal has a critical breakdown field and a critical sustaining field determined by said impurity element concentrations, means for applying across said crystal an electric field having a magnitude below said breakdown field and above said sustaining field, means for reversing the relationship of said applied field to said breakdown field whereby the rate of ionization by impact within said applied field exceeds the rate of recombination producing a reversible non-destructive avalanche breakdown and said semiconductor crystal is shifted from a state of low prebreakdown conductivity through a region of negative resistance to a stable state of high conductivity, and means for reversing the relationship of said applied field to said sustaining field to restore said semiconductor crystal to said state of low prebreakdown conductivity.

2. A bistable semiconductor switching device comprising a crystal of compensated germanium containing predetermined concentrations of both acceptor and donor impurity elements, a pair of spaced electrodes making ohmic contact thereto, means for cooling said crystal to a temperature at which said impurity elements are deionized and said compensated germanium crystal has a critical breakdown field and a critical sustaining field determined by said impurity element concentrations, means applying across said crystal an electric field having a magnitude below said breakdown field and above said sustaining field, means for reversing the relationship of said applied field to said breakdown field whereby the rate of ionization by impact within said applied field exceeds the rate of recombination producing a reversible non-destructive avalanche breakdown and said germanium crystal is shifted from a state of low prebreakdown conductivity through a region of negative resistance to a stable state of high conductivity, and means for reversing the relationship of said applied field to said sustaining field to restore said germanium crystal to said state of low prebreakdown conductivity.

3. The apparatus defined in claim 2 wherein said means for reversing the relationship of said applied field to said breakdown field includes the exposure of said germanium crystal to incident illumination.

4. The apparatus defined in claim 2 wherein said means for reversing the relationship of said applied field to said sustaining field includes the exposure of said germanium crystal to incident illumination.

5. The apparatus defined in claim 2 wherein said means for reversing the relationship of said applied field to said breakdown field includes the application of a crystal oriented magnetic field.

6. The apparatus defined in claim 2 wherein said means for reversing the relationship of said applied field to said sustaining field includes the application of a magnetic field.

7. A bistable semiconductor switching device comprising a composite slab of compensated germanium having a first layer containing both acceptor and donor impurity elements at a first predetermined impurity density and a second layer containing both acceptor and donor impurity elements at a second predetermined impurity density greater than said first layer, a pair of electrodes, one of said electrodes making ohmic contact to said first layer and the second of said electrodes making ohmic contact to said second layer, means for cooling said slab to a temperature at which said impurity elements are deionized and each layer of said slab possesses a critical breakdown field and a critical sustaining field, the prebreakdown conductivities of said first and second layers being so related that the critical breakdown field is reached at a lower current flow through said electrodes for said first layer than for said second layer, the thicknesses of said first and second layers being so related that said critical breakdown field for said first layer is reached at a lower applied voltage at said electrodes than said critical breakdown field for said second layer, means applying a voltage across said composite slab to establish an electric field across each layer having a magnitude below said breakdown field for either layer and above said sustaining field for said first layer, means for causing the rate of ionization by impact within said applied field to exceed the rate of recombination for said first layer whereby said first layer is shifted from a state of low prebreakdown conductivity to a state of high postbreakdown conductivity while the state of said second layer is unchanged, and means for restoring said first layer to said state of low prebreakdown conductivity.

8. A multistable semiconductor switching device comprising a composite slab of compensated germanium having a first layer containing both acceptor and donor impurity elements at a first predetermined impurity density and a second layer containing both acceptor and donor impurity elements at a second predetermined impurity density greater than said first layer, a pair of electrodes, one of said electrodes making ohmic contact to said first layer and the second of said electrodes making ohmic contact to said second layer, means for cooling said slab to a temperature at which said impurity elements are deionized and each layer of said slab possesses a critical breakdown field and a critical sustaining field, the prebreakdown conductivities of said first and second layers being so related that the critical breakdown field is reached at a lower current flow through said electrodes for said first layer than for said second layer, the thickness of said first layer being so related to the thickness of said second layer that said critical breakdown field for said second layer requires a lower applied voltage at said electrodes than said critical breakdown field for said first layer and said sustaining field for said second layer requires a higher applied voltage at said electrodes than said sustaining field for said first layer, means for applying a voltage across said slab to establish an electric field across each layer having a magnitude above said sustaining field for said first layer and below said sustaining field for said second layer, means for applying voltage pulses of a first polarity to said electrodes to cause said applied field to exceed said breakdown field for said first and second layers thereby to shift both layers of said slab from a first stable state of low prebreakdown conductivity to a second stable state of high postbreakdown conductivity for the time duration of said pulse, termination of said pulse restoring said applied field to a magnitude sustaining postbreakdown conductivity in said first layer and insufficient to sustain postbreakdown conductivity in said second layer thereby shifting said slab to a third stable state of conductivity.

9. A multistable semiconductor switching device comprising a composite slab of compensated germanium having a first layer containing both acceptor and donor impurity elements at a first predetermined impurity density and a second layer containing both acceptor and donor impurity elements at a second predetermined impurity density greater than said first layer, a pair of electrodes, one of said electrodes making ohmic contact to said first layer and the second of said electrodes making ohmic contact to said second layer, means for cooling said slab to a temperature at which said impurity elements are deionized and each layer of said slab possesses a critical breakdown field and a critical sustaining field, the prebreakdown conductivities of said first and second layers being so related that the critical breakdown field is reached at a lower current flow through said electrodes for said first layer than for said second layer, the thickness of said first layer being so related to the thickness of said second layer that said critical breakdown field for said second layer requires a lower applied voltage at said electrodes than said critical breakdown field for said first layer and said sustaining field for said second layer requires a higher applied voltage at said electrodes than said sustaining field for said first layer, means for applying a voltage across said slab to establish an electric field across each layer having a magnitude above said sustaining field for said first layer and below said sustaining field for said second layer, and means for applying voltage pulses of a first polarity to said electrodes to cause said applied field to exceed said breakdown field for said first and second layers thereby to shift both layers of said slab from a first stable state of low prebreakdown conductivity to a second stable state of high postbreakdown conductivity for the time duration of said pulse, termination of said pulse restoring said applied field to a magnitude sustaining postbreakdown conductivity in said second layer, thereby shifting said slab to a third stable state of conductivity, and means for applying voltage pulses of a second polarity to said electrodes to cause said applied field to become lower than the field required to sustain high postbreakdown conductivity in said first layer whereby said slab is restored to said first stable state of low prebreakdown conductivity for both of said layers.

10. A multistable semiconductor switching device comprising a composite slab of compensated germanium having a plurality of layers, each of said layers containing both acceptor and donor impurity elements in predetermined densities changing by predetermined amounts progressively from one surface of said slab to the second surface of said slab, an ohmic contact for each surface of said slab, means for cooling said slab to a temperature at which said impurity elements are deionized and each layer of said slab possesses a critical breakdown field and a critical sustaining field, a voltage source connected to said contacts, the thickness and prebreakdown conductivity of each of said plurality of layers being so that as the voltage of said source is increased the critical breakdown fields are reached for a succession of said layers to shift said layers from a state of low prebreakdown conductivity to a second state of higher postbreakdown conductivity, and as the voltage of said source is decreased each layer in succession is shifted from said second state to said first state whereby said device may be switched to cause any desired layer to shift its state of conductivity.

11. A bistable semiconductor switch comprising a thin slab of compensated germanium containing predetermined concentrations of both acceptor and donor impurity elements, said slab having an ohmic contact on each surface thereof, a liquid helium bath surrounding said slab thereby cooling said slab to a temperature at which said impurity elements are deionized and said compensated germanium has a critical breakdown field and a critical sustaining field related to said impurity element concentrations, a constant voltage source, means for connecting said contacts to said source to apply across said slab an electric field having a magnitude below said breakdown field and above said sustaining field, means for applying voltage pulses of a first polarity to said contacts to cause said applied field to exceed said breakdown field for the time duration of said pulse thereby to shift said germanium slab from a first state of low prebreakdown conductivity to a second state of high postbreakdown conductivity which is stable upon termination of said pulse, and means for applying voltage pulses of a second polarity to said contacts to cause said applied field to fall below said sustaining field for the time duration of said pulse to restore said germanium slab to said first state of low prebreakdown conductivity which is stable upon termination of said pulse of second polarity.

12. A bistable semiconductor switch comprising a thin slab of compensated germanium containing predetermined concentrations of both acceptor and donor impurity elements, said slab having an ohmic contact on each surface thereof, a liquid helium bath surrounding said slab thereby cooling said slab to a temperature at which said impurity elements are deionized and said compensated germanium has a critical breakdown field and a critical sustaining field related to said impurity element concentrations, a constant voltage source, means for connecting said contacts to said source to apply across said slab an electric field having a magnitude below said breakdown field and above said sustaining field, a source of illumination, means for exposing said slab to light from said source, the intensity of said source having a magnitude sufficient to lower said critical breakdown field below said applied field whereby said illuminated slab is shifted from a first state of low prebreakdown conductivity through a negative resistance region to a state of high postbreakdown conductivity, and means for reducing said applied field to a magnitude below said sustaining field to restore said slab to said first state of low prebreakdown conductivity.

13. A bistable semiconductor switch comprising a thin slab of compensated germanium containing predetermined concentrations of both acceptor and donor impurity elements, said slab having an electrode on each surface making ohmic contact thereto, a liquid helium bath surrounding said slab thereby cooling said slab to a temperature at which said impurity elements are deionized and said compensated germanium has a critical breakdown field and a critical sustaining field related to said impurity element concentrations, a constant voltage source, means for connecting said electrodes to said source to apply across said slab an electric field having a magnitude below said breakdown field and above said sustaining field, a source of illumination, a source of voltage pulses, means for applying voltage pulses to said electrodes of a polarity to increase said applied field in magnitude, means for exposing said slab to light from said source, the intensity of said source having a magnitude sufficient to lower said breakdown field below the magnitude of said pulse increased applied field whereby time coincident application of said pulses and exposure to said source of illumination causes said slab to be shifted from a first state of low prebreakdown conductivity through a negative resistance region to a state of high postbreakdown conductivity, and means for applying voltage pulses of a second polarity to said electrodes to lower said applied field to a magnitude below said sustaining field whereby said slab is restored to said first of low prebreakdown conductivity which is stable upon termination of said voltage pulse of second polarity.

14. An array of bilateral semiconductor switching elements comprising a wafer of compensated semiconductor material containing predetermined concentrations of both acceptor and donor impurities, a plurality of spaced parallel line ohmic contacts on each face of said wafer, the spacing between adjacent contacts on the same face being greater than the thickness of said wafer, the line contacts on one face being perpendicular to the line contacts on the second face to define a plurality of individual switching elements at the intersection of each row and column of the matrix so formed, means for cooling said wafer to a temperature at which said acceptor and donor impurities deionize and said semiconductor material possesses a critical breakdown field and a critical sustaining field, means for applying a voltage bias between said ohmic contacts on one face and said ohmic contacts on said second face to establish a predetermined electric field having a magnitude greater than said sustaining field and less than said breakdown field, means for applying to selected row and column line contacts in time coincidence first and second voltage pulses respectively opposed in polarity and of such magnitude to subject the semiconductor material to an electric field above said critical breakdown field whereby only said selected elements are switched thereby from a state of low prebreakdown conductivity through a negative resistance region to a state of high conductivity which is stable in the presence of said predetermined field, and means for reducing the electric field across said wafer below said critical sustaining field to restore said selected elements to said state of low prebreakdown conductivity.

15. An array of bilateral semiconductor switching elements comprising a wafer of compensated semiconductor material containing predetermined concentrations of both acceptor and donor impurities, a first plurality of ohmic contacts arranged on one face of said wafer in a predetermined geometrical pattern; a second plurality of ohmic contacts arranged on the second face of said wafer in said geometrical pattern, the spacing between adjacent contacts on the same face being greater than the thickness of said wafer, each ohmic contact on one face of said wafer being located directly opposite an ohmic contact on the second face of said wafer to define a plurality of individual elements having a unique location, means for cooling said wafer to a temperature at which said acceptor and donor impurities deionize and said semiconductor material possesses a critical breakdown field and a critical sustaining field, means for applying a voltage bias between said ohmic contacts on one face and said ohmic contacts on said second face to establish a predetermined electric field having a magnitude greater than said sustaining field and less than said breakdown field, means for applying to selected opposed contacts in time coincidence first and second voltage pulses respectively opposed in polarity and of such magnitude to subject the semiconductor material to an electric field above said critical breakdown field whereby only said selected elements are switched thereby from a state of low pre-breakdown conductivity through a negative resistance region to a state of high conductivity which is stable in the presence of said predetermined field, and means for reducing the electric field across said wafer below said critical sustaining field to restore said selected elements to said state of low prebreakdown conductivity.

16. An array of bilateral semiconductor switching elements comprising a wafer of compensated semiconductor material containing predetermined concentrations of both acceptor and donor impurities, a first plurality of ohmic button contacts on one face of said wafer electrically interconnected to form parallel rows of connected contacts, a second plurality of ohmic button contacts on the second face of said wafer electrically interconnected to form parallel columns of connected contacts perpendicular to said rows of contacts, the spacing between adjacent contacts on the same face of said wafer being greater than the thickness of said wafer, each ohmic contact on one face of said wafer being directly opposite an ohmic contact on the second face of said wafer to define a plurality of individual elements each having a unique row and column location in the matrix so formed, means for cooling said wafer to a temperature at which said acceptor and donor impurities deionize and said semiconductor material possesses a critical breakdown field and a critical sustaining field, means for applying a voltage bias between said ohmic contacts on one face and said ohmic contacts on said second face to establish a predetermined electric field having a magnitude greater than said sustaining field and less than said breakdown field, means for applying to selected row and column line contacts in time coincidence first and second voltage pulses respectively opposed in polarity and of such magnitude to subject the semiconductor material to an electric field above said critical breakdown field whereby only said selected elements are switched thereby from a state of low prebreakdown conductivity through a negative resistance region to a state of high conductivity which is stable in the presence of said predetermined field, and means for reducing the electric field across said wafer below said critical sustaining field to restore said selected elements to said state of low prebreakdown conductivity.

17. An array of bilateral semiconductor switching elements comprising a wafer of compensated semiconductor material containing predetermined concentrations of both acceptor and donor impurities, a plurality of spaced parallel line ohmic contacts on each face of said wafer, the spacing between adjacent contacts on the same face being greater than the thickness of said wafer, the line contacts on one face being parallel to the line contacts on the second face to define a plurality of individual switching elements at the intersection of each row and column of the matrix so formed, means for cooling said wafer to a temperature at which said acceptor and donor impurities deionize and said semiconductor material possesses a critical breakdown field and a critical sustaining field, means for applying a voltage bias between said ohmic contacts on one face and said ohmic contacts on said second face to establish a predetermined electric field having a magnitude greater than said sustaining field and less than said breakdown field, means for illuminating selected switching elements whereby said critical field for breakdown is lowered for said selected elements, means for applying to certain row and column line contacts in time coincidence first and second voltage pulses respectively opposed in polarity and of such magnitude to subject the semiconductor material to an electric field below said critical breakdown field for unilluminated elements and above said critical breakdown field for illuminated elements, whereby only said illuminated elements are switched thereby from a state of low prebreakdown conductivity through a negative resistance region to a state of high conductivity which is stable in the presence of said predetermined field, and means for reducing the electric field across said wafer below said critical sustaining field to restore said selected illuminated elements to said state of low prebreakdown conductivity.

18. A bistable semiconductor switch comprising a thin slab of germanium containing a predetermined acceptor impurity element density compensated by a lesser donor impurity element density to yield a predetermined net acceptor density providing p-type conductivity throughout said slab, said slab having an ohmic contact on each surface thereof, a liquid helium bath surrounding said slab thereby cooling said slab to a temperature at which said impurity elements are deionized and said compensated germanium has a critical breakdown electric field and a critical sustaining electric field lower in magnitude than said breakdown field, a constant voltage source, means for connecting said contacts to said source to apply across said slab an electric field having a magnitude below said breakdown field and above said sustaining field, means for causing the effect of said applied field to exceed said breakdown field to shift said germanium from a first stable state of low conductivity through a negative resistance region to a second stable state of high conductivity within the zone of said slab lying between said contacts, and means for causing the effect of said applied field to fall below said sustaining field to restore said zone to said first stable state of low conductivity.

References Cited in the file of this patent

UNITED STATES PATENTS

| | | |
|---|---|---|
| 2,430,457 | Dimond | Nov. 1, 1947 |
| 2,717,373 | Anderson | Sept. 6, 1955 |
| 2,812,445 | Anderson | Nov. 5, 1957 |
| 2,877,358 | Ross | Mar. 10, 1959 |
| 2,884,617 | Pulvari | Apr. 28, 1959 |
| 2,891,160 | Le Blond | June 16, 1959 |
| 2,914,747 | Straube | Nov. 24, 1959 |
| 2,994,121 | Shockley | Aug. 1, 1961 |
| 3,011,133 | Koenig et al. | Nov. 28, 1961 |

OTHER REFERENCES

Publication, RCA Technical Notes RCATN No. 172, "Impact Ionization Device," Steele, M. C., received Aug. 18, 158.